(12) United States Patent
Jung

(10) Patent No.: US 6,489,188 B2
(45) Date of Patent: *Dec. 3, 2002

(54) LASER ANNEALING SYSTEM FOR CRYSTALLIZATION OF SEMICONDUCTOR LAYER AND METHOD OF THE SAME

(75) Inventor: Yunho Jung, Seoul (KR)

(73) Assignee: LG. Philips LCD Co., LTD, Seoul (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/539,552

(22) Filed: Mar. 31, 2000

(65) Prior Publication Data

US 2002/0068391 A1 Jun. 6, 2002

(30) Foreign Application Priority Data

Mar. 31, 1999 (KR) .................................. 99-11253

(51) Int. Cl.[7] .......................... H01L 21/00; H01L 21/84; H01L 21/336; H01L 21/331
(52) U.S. Cl. ................. 438/166; 438/293; 438/308; 438/378; 438/486; 438/487
(58) Field of Search ............................ 438/166, 293, 438/308, 378, 486, 487, 796

(56) References Cited

U.S. PATENT DOCUMENTS

| | | | | |
|---|---|---|---|---|
| 5,366,926 A | * | 11/1994 | Mei et al. ................... | 437/173 |
| 5,918,140 A | * | 6/1999 | Wickboldt et al. .......... | 438/535 |
| 5,936,291 A | * | 8/1999 | Makita et al. ............... | 257/405 |
| 5,970,369 A | * | 10/1999 | Hara et al. .................. | 438/488 |
| 5,981,974 A | * | 11/1999 | Makita et al. ................ | 257/72 |
| 5,998,838 A | * | 12/1999 | Tanabe et al. ............... | 257/347 |
| 6,071,796 A | * | 6/2000 | Voutsas ...................... | 438/487 |
| 6,121,076 A | * | 9/2000 | Zhang et al. ................ | 438/150 |
| 6,180,957 B1 | * | 1/2002 | Miyasaki et al. ............. | 257/57 |

* cited by examiner

Primary Examiner—John F. Niebling
Assistant Examiner—Viktor Simkovic
(74) Attorney, Agent, or Firm—McKenna Long & Aldridge

(57) ABSTRACT

The present invention discloses a method for forming a polycrystalline semiconductor layer on a substrate at an atmospheric pressure, including: providing a chamber having an opening portion and a stage therein; forming an amorphous semiconductor layer on the substrate; positioning the amorphous semiconductor layer formed on the substrate on the stage of the chamber; and irradiating five to twelve laser beam shots to every position of a desired portion of the semiconductor layer over the stage through the opening portion of the chamber.

32 Claims, 5 Drawing Sheets

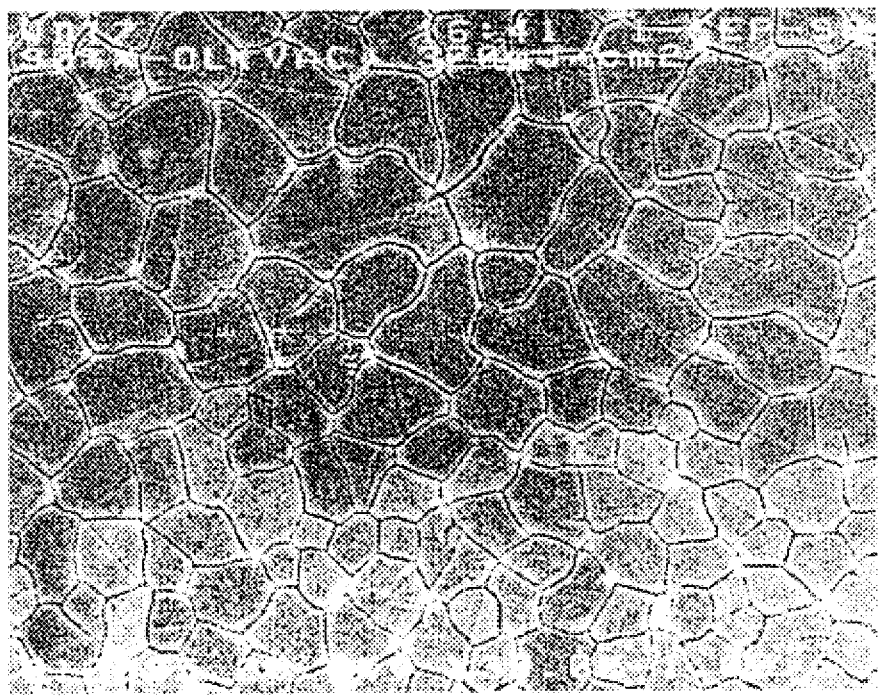
(Related Art)
(Fig. 5A)
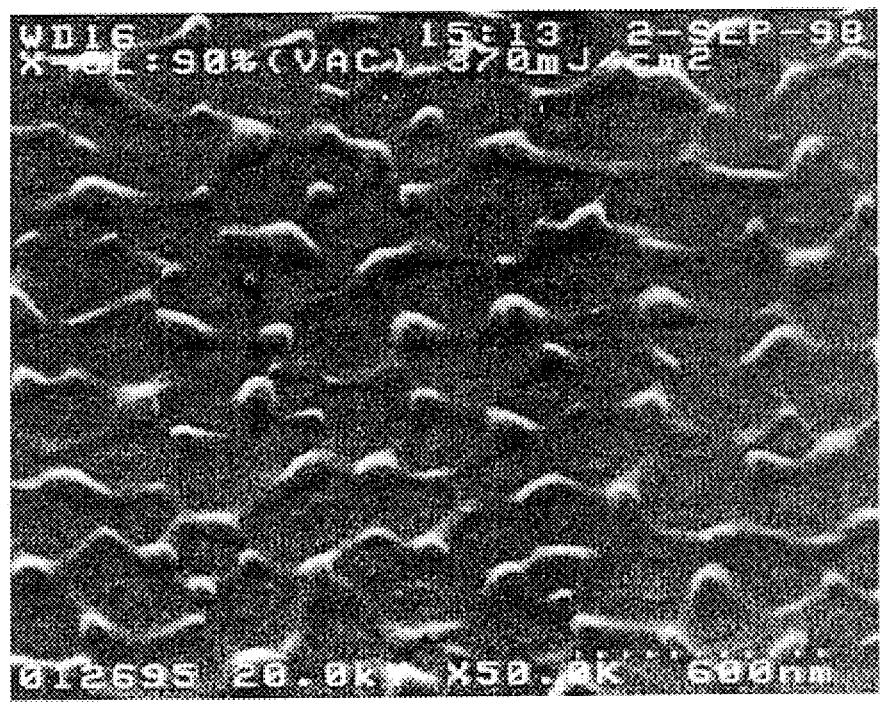
(Related Art)
(Fig. 5B)

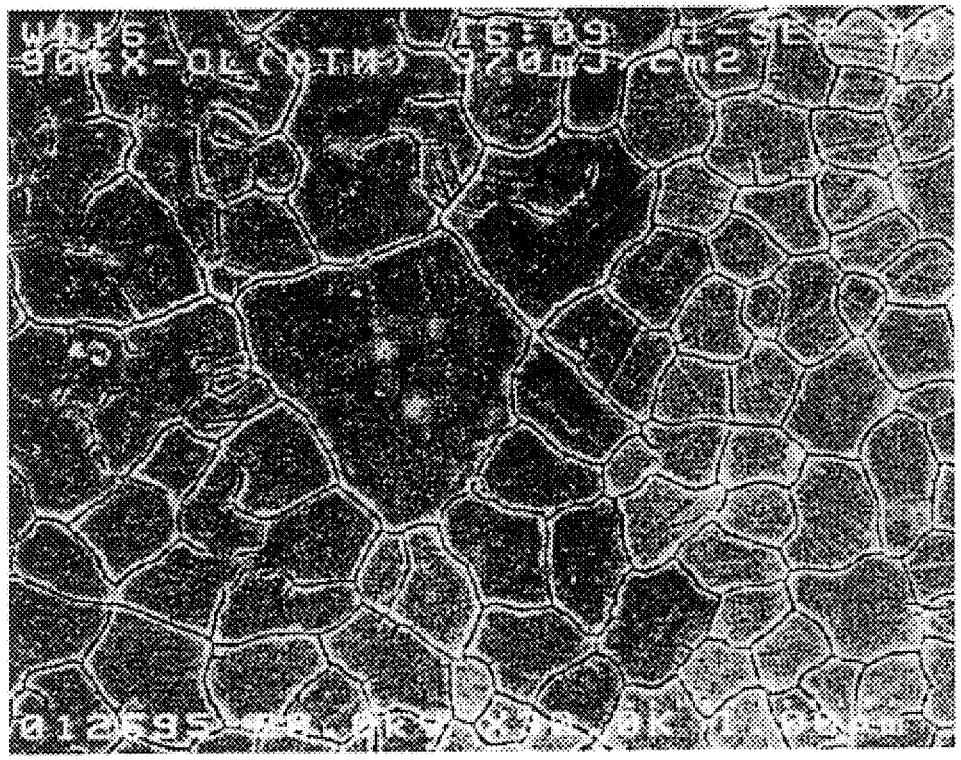
(Fig. 6A)
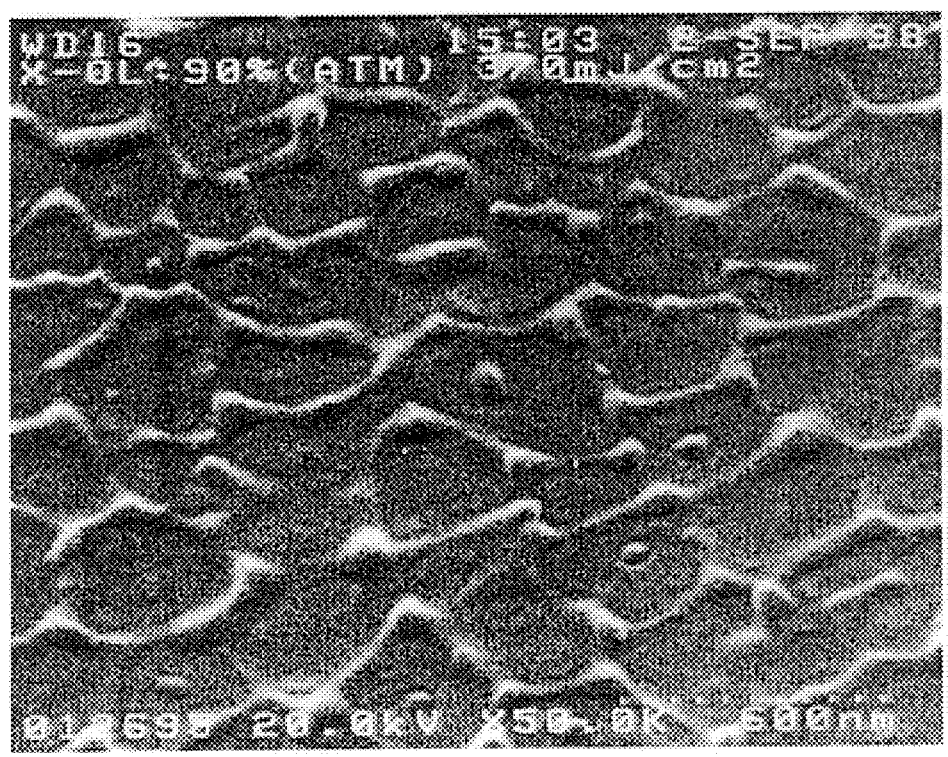
(Fig. 6B)

LASER ANNEALING SYSTEM FOR CRYSTALLIZATION OF SEMICONDUCTOR LAYER AND METHOD OF THE SAME

CROSS REFERENCE

This application claims the benefit under 35 U.S.C. §119, of Korean Patent Application No. 1999-11253, filed on Mar. 31, 1999, the entirety of which is hereby incorporated by reference.

BACKGROUND OF THE INVENTION

1. Field of the Invention

The present invention relates to a method for manufacturing a polycrystalline silicon layer, and more particularly, to a system and a method for manufacturing a polycrystalline silicon layer for use in a thin film transistor (TFT) using a laser annealing technique.

2. Description of Related Art

In general, there are two methods for manufacturing an active layer for use in a polycrystalline thin film transistor (TFT). The first method involves depositing a polycrystalline material and patterning it to form a polycrystalline semiconductor layer as the active layer of the TFT. The other method involves depositing, patterning, and heat-treating an amorphous silicon layer to form a polycrystalline silicon layer as the active layer of the TFT using an excimer laser annealing technique or a furnace annealing technique.

In case of the former method, a polycrystalline silicon layer is used as the active layer and an impurity ion gas of a nitrogen group or a boron group is doped into both ends of the polycrystalline silicon layer to define source and drain regions. At this point, the polycrystalline silicon layer undergoes a laser annealing using a rare gas halide laser such as Ar, ArF, KrF, or XeCl to activate the gas doped into the source and drain regions. Laser annealing is also performed to recrystallize amorphous portions of the polycrystalline silicon layer formed due to energy generated when the impurity ion gas is doped.

In case of the latter method, first an amorphous silicon layer is deposited on a substrate using a sputtering technique. The layer then undergoes laser annealing to form the polycrystalline silicon layer.

As described above, the laser annealing is mainly used to manufacture the active layer for use in a polycrystalline thin film transistor or to activate the doped impurity ion gas to define the source and drain regions of the polycrystalline silicon layer.

FIG. 1 is a schematic view illustrating a configuration of a conventional laser annealing system.

The conventional laser annealing system includes a vacuum chamber 1 having a laser beam passage window 13 made of a transparent material such as a rock-crystal, a vacuum device 3 having a vacuum pump 31 and a vacuum tube 33 to place the vacuum chamber 1 in a specific atmosphere, for example, a vacuum or nitriding atmosphere, a laser device 5 that irradiates a laser beam with a predetermined energy through the laser beam passage window 13, and a stage 50 on which an amorphous silicon layer 23 on a substrate 21 as a workpiece is placed.

A method of manufacturing the polycrystalline silicon layer using the conventional laser annealing system described above will be explained.

First, the amorphous silicon layer 23 on the substrate 21 is located on the stage 50 in the vacuum chamber 1, and then the vacuum device 3 is operated to place the amorphous silicon layer 23 in a vacuum or nitride atmosphere. A laser beam is irradiated from the laser device 5 through the laser beam passage window 13 to scan the amorphous silicon layer 23 on the substrate 21 on the stage 50. At this point, the laser device 5 preferably produces about 200 to 300 laser beam pulses per second. As a result, the amorphous silicon layer 23 on the substrate 21 is converted into a polycrystalline silicon layer.

Furthermore, the impurity-doped ion gas defining the source and drain regions of the polycrystalline silicon layer is activated through the laser annealing technique described above.

In the vacuum method of the conventional art, as the number of shots increases, the layer quality increases. That is, the grain size becomes large, and the roughness of the surface can be improved as the number of shots is increased.

The conventional laser annealing system and the method for polycrystallization and activation described above have the following disadvantages: 1) the process takes a long time because the inside of the vacuum chamber 1 must be maintained in a specific atmosphere, for example, a vacuum or a nitriding atmosphere; 2) high-cost because a high-cost material such as a rock-crystal must be used for the laser beam passage window 13 and the vacuum device 3 is required; and 3) possible damage to the laser beam passage window 13 may result if part of the polycrystalline silicon layer 23 comes undone from the substrate 21. As shown in FIG. 2, a part 41 of the polycrystalline silicon layer 23 that comes undone may be deposited on the laser beam passage window 13 due to energy of the laser beam irradiated.

SUMMARY OF THE INVENTION

To overcome the problems described above, a preferred embodiment of the present invention provides a laser annealing system and a method for laser annealing that can be performed in a normal atmosphere and that forms a polycrystalline silicon layer having layer-sized crystals as an active layer of a thin film transistor.

In order to achieve the above object, the present invention provides a method for forming a polycrystalline semiconductor layer on a substrate at an atmospheric pressure, comprising: providing a chamber having an opening and a stage therein; forming an amorphous semiconductor layer on the substrate; positioning the amorphous semiconductor layer formed on the substrate on the stage of the chamber; and irradiating five to twelve laser beam shots to every position of a desired portion of the semiconductor layer over the stage through the opening of the chamber.

The present invention further provides a method for activating impurity-doped ion gas in a polycrystalline semiconductor layer on a substrate at an atmospheric pressure, comprising: providing a chamber having an opening and a stage therein; providing the polycrystalline semiconductor layer including a region having impurity-doped ion gas therein, the polycrystalline semiconductor layer being positioned on the substrate; positioning the polycrystalline semiconductor layer having the impurity-doped ion gas therein together with the substrate on the stage of the chamber; and irradiating five to twelve laser beam shots to every position of the region having the impurity-doped ion gas of the polycrystalline semiconductor layer over the stage through the opening of the chamber.

The laser beam includes one of a group consisting of Ar, ArF, KrF, and XeCl. The laser beams may be intermittently applied to the amorphous semiconductor layer, or the laser beams may be continuously applied to the amorphous semiconductor layer.

BRIEF DESCRIPTION OF THE DRAWINGS

For a more complete understanding of the present invention and the advantages thereof, reference is now made to the following descriptions taken in conjunction with the accompanying drawings, in which:

FIG. 5A is a photograph illustrating grain boundaries of the polycrystalline silicon layer fabricated in a vacuum with ten laser shots according to the conventional art;

FIG. 5B is a photograph illustrating the roughness of the grain boundaries of a polycrystalline silicon layer fabricated in a vacuum with ten laser shots, according to the conventional art;

FIG. 6A is a photograph illustrating the grain boundaries of a polycrystalline silicon layer fabricated in a normal atmosphere with ten laser shots, according to a preferred embodiment of the present invention; and FIG. 6B is a photograph illustrating the roughness of the grain boundaries of the polycrystalline silicon layer of FIG. 6A.

DETAILED DESCRIPTION OF PREFFERED EMBODIMENTS

Reference will now be made in detail to a preferred embodiment of the present invention, an example of which is illustrated in the accompanying drawings.

Figure 1:
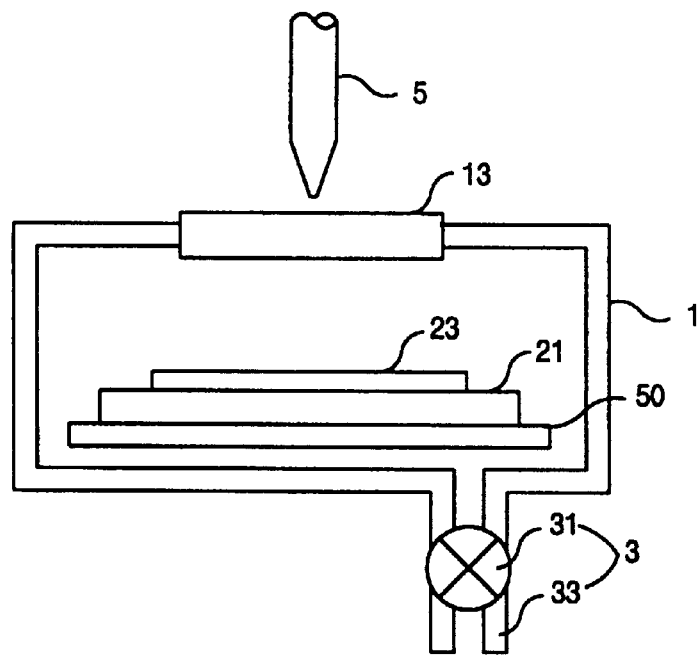
FIG. 1 is a schematic view illustrating a configuration of a conventional laser annealing system.
Figure 2:
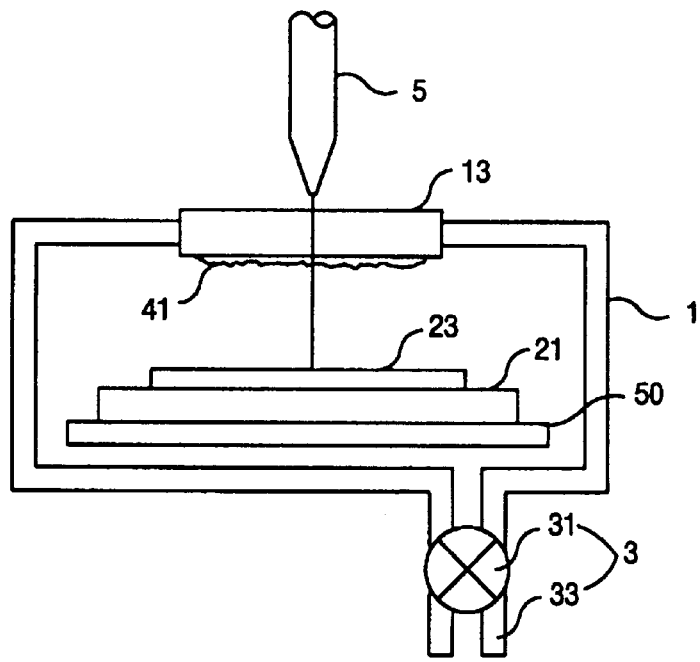
FIG. 2 is a schematic view illustrating a problem that may occur when a laser annealing is performed in the conventional laser annealing system.
Figure 3:
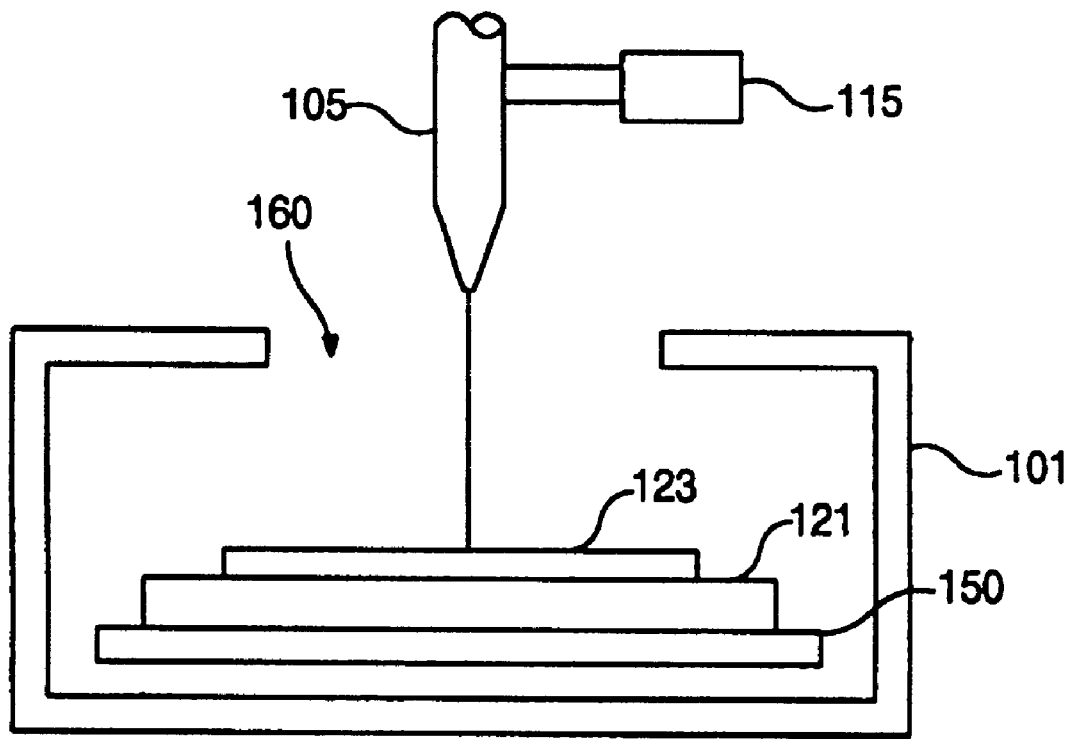
FIG. 3 is a schematic view illustrating a configuration of a laser annealing system according to a preferred embodiment of the present invention.

FIG. 3 is a schematic view illustrating a configuration of a laser annealing system according to a preferred embodiment of the present invention. As shown in FIG. 3, the laser annealing system includes a process chamber 105 having an opening 160 that allows a laser beam to pass through, a laser device 105 that irradiates a laser beam with a predetermined energy through the opening 160, a stage 50 on which an amorphous silicon layer 123 deposited on a substrate 121 is placed as a workpiece, and a laser adjuster 115 for adjusting laser emission output. At this point, the laser beam includes one of a group consisting of Ar, ArF, KrF, and XeCl.

The laser annealing system described above can be applied to both a polycrystallization process of the amorphous semiconductor layer and an activation process of the impurity-doped ion gas to define the source and drain regions. A preferred embodiment of the present invention will be discussed in the context of the polycrystallization process.

First, either the amorphous silicon layer 123 on the substrate 121 or a polycrystalline silicon layer whose both ends are doped by impurity ion gas is placed on the stage 150 in the process chamber 101. At this point, the process chamber 101 is maintained in a normal atmosphere. The laser device 105 can emit either of a continuous laser beam and an intermittent pulse laser beam, and can also move back and forth or right and left by a moving means such as servo motors (not shown) such that the amorphous silicon layer 123 is scanned uniformly. The laser device 105 preferably irradiates five to twelve laser beam pulses to a target of the amorphous silicon layer 123 under the control of the laser adjuster 115.

The energy of one laser beam pulse is between a complete melting energy and a surface melting energy. The complete melting energy, which is dependent on a thickness of the silicon layer, means the energy that can melt the amorphous silicon layer completely, thereby causing no seed of crystal or too many seeds of very tiny sized crystal. The surface melting energy means the energy that can melt only the surface of the silicon layer. One pulse of the laser beam can satisfy crystallization/activation. In this embodiment, the energy density per pulse is 290 to 400 mJ/cm2 for an amorphous silicon with a thickness of 600 Angstroms.

When laser annealing is performed in a normal atmosphere for polycrystallization of the amorphous silicon layer, the amorphous silicon layer has an oxidation film on a surface thereof due to oxygen existing in the atmosphere when the amorphous silicon layer is heated during polycrystallization. Such an oxidation film deteriorates the roughness characteristic of grain boundaries, leading to bad electric characteristics of the polycrystalline silicon layer. In order to overcome this problem, the preferred embodiment of the present invention provides a method of adjusting the number of laser shots irradiated to a desired position of the amorphous silicon layer so that roughness of the grain boundaries on the surface is improved. Laser annealing is a technique in which the laser beam is irradiated to a specific position of the amorphous semiconductor layer for crystallization. A polycrystalline semiconductor layer having a good electric characteristics can be attained when the laser beam is irradiated several times. According to the experiments preformed by the present inventor, the preferred number of laser shots is five to twelve and the ideal number of laser shots irradiated to a specific position of the amorphous semiconductor layer has been found to be ten. In normal atmosphere, in the condition of below 5 shots, the uniformity of the grain size is not good, and transfer character of the TFT is not good. And as the number of shots increases, the small sized grains disappear and big-sized grain appear. With more than 12 laser shots, the grain boundary arises from the surface of the silicon layer. When the number of laser shots is more than fifteen, the amorphous semiconductor layer may be destroyed and ultimately come to be discarded.

As shown in FIGS. 5B and 6B, roughness of the polycrystalline silicon layer fabricated according to the preferred embodiment of the present invention is much improved over the conventional art.

There are several methods to adjust the number of laser shots to five to twelve. Two representative methods will be explained as follows.

First, in case that the laser device 105 emits an intermittent pulse laser beam, the laser device 105 is adjusted to emit 200 to 300 laser pulses per second, and the laser beam generated from the laser device 105 has a duration of 25 ns to 50 ns per pulse. When the laser beam is emitted to the amorphous silicon layer 123 on the substrate 121, the laser device 105 is adjusted by the laser adjuster 115 to irradiate 5–12 pulsed laser beams to a specific position of the amorphous silicon layer 123. The entire surface of the amorphous silicon layer 123 is uniformly scanned in the same way. For instance, in case that the laser device 105 irradiates 200 pulses per second, if the laser device 105 scans the entire surface of the amorphous silicon layer 123 while moving at the speed of 5/200 second per a cross-sectional area of the laser beam, about 5 laser beam pulses are irradiated to a specific position of the amorphous silicon layer. Furthermore, if the laser device 105 scans the entire surface of the amorphous silicon layer 123 while moving at the speed of 12/200 second per cross-sectioned area of the laser beam, about five to twelve laser beam pulses are irradiated to a specific position of the amorphous silicon layer 123.

Second, in the case that the laser device 105 emits a continuous laser beam, in order to have such an effect an the intermittent laser beam, it is necessary to adjust the scanning time according to the cross-sectional area of the laser beam. In an embodiment in which the laser adjuster 115 has a scanner with a scanning time of 25 ns to 50 ns per point of the amorphous silicon layer 123 corresponding to a size of the cross-sectional area of the laser beam, it is required that the laser beam irradiates the entire surface of the amorphous silicon layer 123 five to twelve times. Therefore, the scanning process is preformed five to twelve times.

Figure 4:
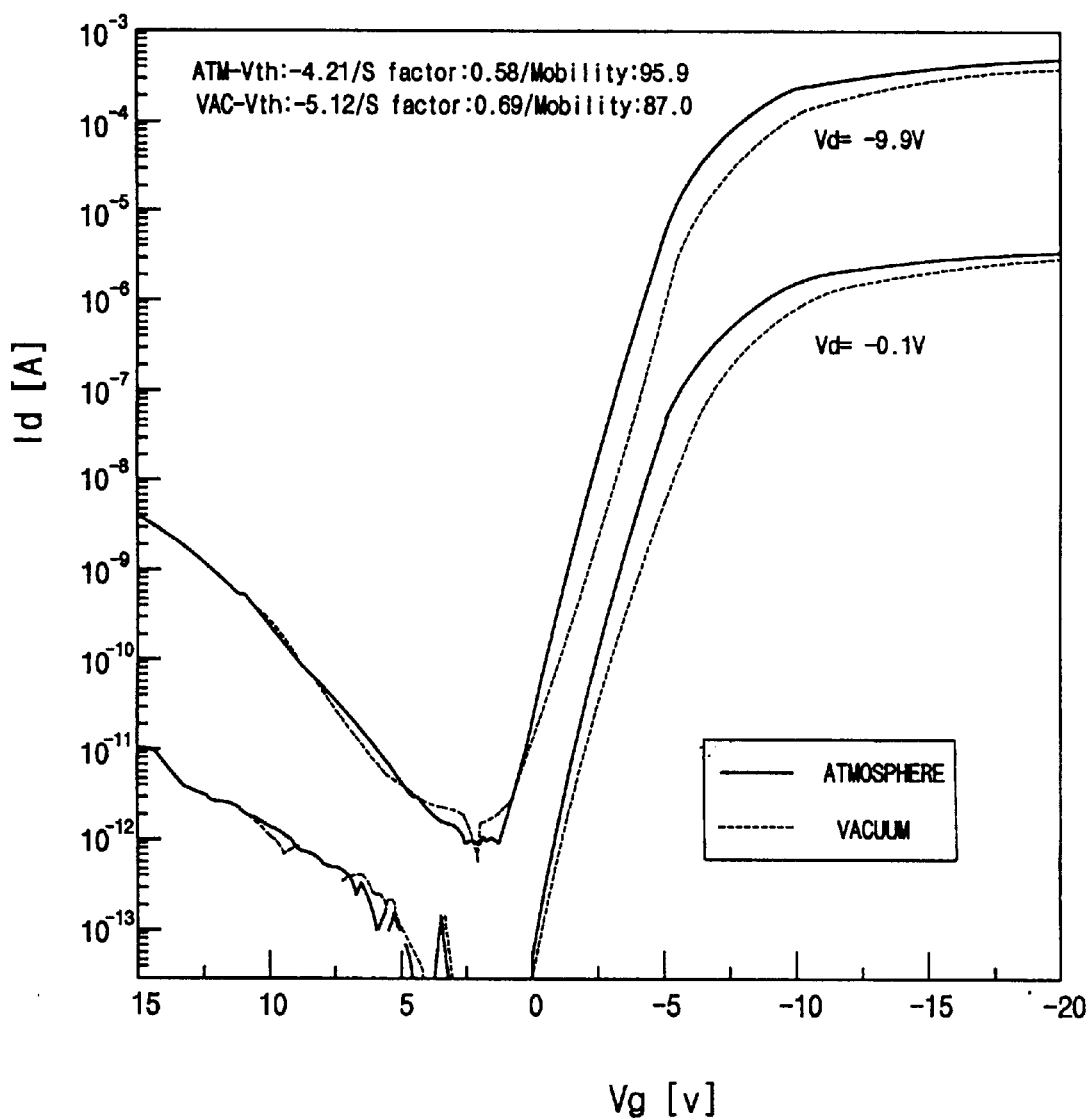
FIG. 4 is a graph illustrating transfer characteristics of polycrystalline silicon thin film transistors (Poly-Si TFTs) fabricated according to the conventional art and a preferred embodiment of the present invention.

FIG. 4 is a graph illustrating transfer characteristics of Poly-Si TFTs, fabricated according to the conventional art and a preferred embodiment of the present invention, respectively. As shown in FIG. 4, the transfer characteristics of the Poly-Si TFT according to the preferred embodiment of the present invention are much better than that of the conventional art.

Further, when laser annealing for polycrystallization is performed in a normal atmosphere, a $SiO_2$ film is formed on the surface of the amorphous silicon layer due to reaction of oxygen and silicon. The $SiO_2$ film prevents heat within the amorphous silicon layer from being rapidly ventilated, increasing crystal growing time leading to layer sized crystal. Therefore, as shown in FIGS. 5A and 6A, grains of the polycrystalline silicon layer according the inventive laser annealing technique is bigger in size than that according to the conventional art.

Further, when the laser annealing for activation of the impurity-doped ion gas contained in the polycrystalline silicon layer is performed in the atmosphere, the source and drain regions formed are so rough that it is difficult for source and drain electrodes of the TFT to respectively contact with the source and drain regions. But, using the laser annealing technique described above, roughness of the regions of the polycrystalline silicon layer corresponding to the source and drain regions is improved. That is, if the two to twelve laser beam shots are applied to the regions of the polycrystalline silicon layer corresponding to the source and drain regions, roughness of the regions of the polycrystalline silicon layer corresponding to the source and drain regions is so much improved that it becomes easier for the source and drain electrodes of the TFT to respectively contact with the source and drain regions.

As described hereinbefore, using the laser annealing system and the method of the same according to the preferred embodiment of the present invention, since roughness of the surface of the polycrystalline silicon layer is much improved over the conventional art, a TFT having good electric characteristics can be manufactured. Further, since the vacuum process is omitted, process time and cost are reduced.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming a polycrystalline semiconductor layer on a substrate at an atmospheric pressure, comprising the steps of:

providing a chamber having an opening therein;

forming an amorphous semiconductor layer on a substrate;

placing the amorphous semiconductor layer in the chamber;

irradiating the amorphous semiconductor layer at least at a specific sub-area under normal atmospheric conditions with five to twelve laser beam shots at each position of the amorphous semiconductor layer for which crystallization is desired through the opening, whereby the amorphous semiconductor layer is changed to a polycrystalline semiconductor layer; and repeating the irradiating step at least at the specific sub-area.

2. The method of claim 1, wherein the laser beam is formed by a gas laser and the gas is selected from the group consisting of Ar, ArF, KrF, and XeCl.

3. The method of claim 1, wherein the laser beams are intermittently applied to the semiconductor layer.

4. The method of claim 1, wherein the laser beams are continuously applied to the semiconductor layer.

5. A method for activating impurity-doped ion gas in a polycrystalline semiconductor layer at an atmospheric pressure, comprising the steps of:

providing a chamber having an opening therein;

providing a polycrystalline semiconductor layer including at least one region having impurity-doped ions;

placing the polycrystalline semiconductor layer in the chamber;

irradiating the at least one region at least at a specific sub-area under normal atmospheric conditions with five to twelve laser beam shots through the opening; and repeating the irradiating step at least at the specific sub-area.

6. The method of claim 5, wherein the laser beam is formed by a gas laser and the gas is selected from the group consisting of Ar, ArF, KrF, and XeCl.

7. The method of claim 5, wherein the laser beams are intermittently applied to the region.

8. The method of claim 5, wherein the laser beams are continuously applied to the region.

9. A method for crystallizing an amorphous silicon layer, the method comprising the steps of:

irradiating the amorphous silicon layer at least at a specific sub-area in a normal atmosphere with a laser beam having an energy greater than a surface melting energy but less than a complete melting energy; and repeating the irradiating step at least the specific sub-area to at least four times but no more than eleven times such that the amorphous silicon layer is irradiated at least five times but no more than twelve times.

10. The method of claim 9, wherein the irradiating step is performed using a pulsed laser beam.

11. The method of claim 9, wherein the irradiating step is performed using a continuous laser beam.

12. The method of claim 9, wherein the laser beam is formed by a gas laser and the gas is selected from the group consisting of Ar, ArF, KrF and XeCl.

13. The method of claim 9, wherein the repeating step is performed nine times such that each portion of the amorphous silicon layer to be crystallized is irradiated ten times.

14. A method for activating impurity-doped ion gas in a polycrystalline semiconductor layer comprising the steps of:
irradiating the layer at least at a specific sub-area in a normal atmosphere with a laser beam having an energy greater than a surface melting energy but less than a complete melting energy; and
repeating the irradiating step at least at the specific sub-area at least four times but no more than eleven times such that the amorphous silicon layer is irradiated at least five times but no more than twelve times.

15. The method of claim 14, wherein the irradiating step is performed using a pulsed laser beam.

16. The method of claim 14, wherein the irradiating step is performed using a continuous laser beam.

17. The method of claim 14, wherein the laser beam is formed by a gas laser and the gas is selected from the group consisting of Ar, ArF, KrF and XeCl.

18. The method of claim 14, wherein the repeating step is performed nine times such that each portion of the layer is irradiated ten times.

19. A method for forming a polycrystalline semiconductor layer, comprising:
forming an amorphous semiconductor layer on a substrate;
crystallizing the amorphous semiconductor layer by irradiating the amorphous semiconductor layer at least at a specific sub-area under normal atmospheric conditions using five to twelve laser beam shots where crystallization is desired; and
repeating the irradiating at least at the specific sub-area.

20. The method of claim 19, wherein the laser beam shots are from a gas laser, and wherein a gas in the gas laser is selected from the group consisting of Ar, ArF, KrF, and XeCl.

21. The method of claim 19, wherein forming the amorphous semiconductor layer produces an amorphous silicon layer.

22. The method of claim 19, wherein crystallizing the amorphous semiconductor layer produces a polycrystalline semiconductor layer.

23. A method for forming a polycrystalline semiconductor layer, comprising:
(a) forming an amorphous semiconductor layer on a substrate;
(b) irradiating the amorphous semiconductor layer at least at a specific sub-area under normal atmospheric conditions using a laser beam;
(c) sweeping the laser beam across the amorphous semiconductor layer where crystallization is desired; and
(d) repeating step (c) five to twelve times at least at the specific sub-area;
whereby said amorphous semiconductor layer undergoes crystallization to form a polycrystalline semiconductor layer.

24. The method of claim 23, wherein the laser beam is continuously applied to the amorphous semiconductor layer.

25. The method of claim 23, wherein the laser beam is from a gas laser, and wherein a gas in the gas laser is selected from the group consisting of Ar, ArF, KrF, and XeCl.

26. The method of claim 23, wherein forming the amorphous semiconductor layer produces an amorphous silicon layer.

27. A method for activating impurity-doped ions, comprising:
forming a polysilicon semiconductor layer having a region doped with impurity ions;
activating the impurity-doped ions by irradiating the region at least at a specific sub-area under normal atmospheric conditions using five to twelve laser beam shots where crystallization is desired; and
repeating the irradiating at least at the specific sub-area.

28. The method of claim 27, wherein the laser beam shots are formed by a gas laser wherein a gas in the gas laser is selected from the group consisting of Ar, ArF, KrF, and XeCl.

29. A method for crystallizing an amorphous silicon layer, the method comprising:
irradiating an amorphous silicon layer at least at a specific sub-area in a normal atmosphere with a laser beam having an energy greater than a surface melting energy, but less than a complete melting energy; and
repeating the irradiating to irradiate the amorphous silicon layer at least at the specific sub-area at least five times but no more than twelve times where crystallization is desired.

30. The method of claim 29, wherein the laser beam is formed by a gas laser having a gas selected from the group consisting of Ar, ArF, KrF, and XeCl.

31. The method of claim 29, wherein the laser beam is continuously applied to the amorphous semiconductor layer.

32. The method of claim 29, wherein the amorphous silicon layer is crystallized to polysilicon.

* * * * *